United States Patent [19]
Lübbe et al.

[11] Patent Number: 5,955,919
[45] Date of Patent: Sep. 21, 1999

[54] NONLINEARITY COMPENSATION IN AN ELECTRIC SIGNAL PROCESSING CIRCUIT

[75] Inventors: Jürgen Lübbe, Jacobneuharting; Peter Kirchlechner, Hohenthann; Jörg Schambacher, München, all of Germany

[73] Assignee: SGS-Thomson Microelectronics GmbH, Grasbrunn, Germany

[21] Appl. No.: 08/900,426

[22] Filed: Jul. 25, 1997

[30] Foreign Application Priority Data

Jul. 26, 1996 [DE] Germany .................. 196 30 393

[51] Int. Cl.⁶ .................................................. H03G 3/12
[52] U.S. Cl. .......................... 330/86; 330/282; 330/284
[58] Field of Search ........................... 330/86, 110, 144, 330/145, 149, 282, 284

[56] References Cited

U.S. PATENT DOCUMENTS

| | | | |
|---|---|---|---|
| 4,509,021 | 4/1985 | Van Uden | 330/282 |
| 4,551,685 | 11/1985 | Kerns, Jr. et al. | 330/86 |
| 5,266,905 | 11/1993 | Johnson | 330/85 |
| 5,523,721 | 6/1996 | Segawa et al. | 330/282 X |

FOREIGN PATENT DOCUMENTS

| | | | |
|---|---|---|---|
| 242405 | 10/1986 | Japan | 330/282 |
| 62-144410 | 6/1987 | Japan . | |

*Primary Examiner*—Steven J. Mottola
*Attorney, Agent, or Firm*—David V. Carlson; Frank Abramonte; Seed and Berry LLP

[57] ABSTRACT

An electric signal processing circuit with an operational amplifier having a signal input, a feedback input and a signal output, and a nonlinear circuit device having a characteristic with a distortion-producing nonlinearity and located in the input signal circuit or in the feedback circuit of the operational amplifier, wherein a compensating circuit device having a characteristic with generally the same nonlinearity as the characteristic of the nonlinear circuit device is disposed in the feedback circuit or in the input signal circuit of the operational amplifier for compensating the distortion of the nonlinear circuit device.

16 Claims, 5 Drawing Sheets

5,955,919

NONLINEARITY COMPENSATION IN AN ELECTRIC SIGNAL PROCESSING CIRCUIT

TECHNICAL FIELD

This invention relates to an electric signal processing circuit having an operational amplifier and a nonlinear circuit device having a characteristic with a distortion-producing nonlinearity and located in the feedback circuit of the operational amplifier.

Such a signal processing circuit can be in particular a volume control for the audio signal processing section of a radio, for example a car radio.

BACKGROUND OF THE INVENTION

An example of a conventional volume control of this type is shown in FIG. 5. It includes operational amplifier OA with noninverting signal input + connected with input signal connection E of the volume control, and inverting feedback input − and signal output A. Between input signal connection E and noninverting signal input + of operational amplifier OA there is switching point P connected via resistor R with signal ground connection SGND. Between output connection A and inverting feedback input − there is a feedback circuit with two cascade-connected resistor strings or voltage dividers ATT2 and ATT16. These two voltage dividers ATT2 and ATT16 have not only a different number of component voltage taps but different component voltage gradations. While ATT2 has eight component voltage taps and a component voltage gradation of 2 dB between adjacent component voltage taps in the shown embodiment, ATT16 has four component voltage taps and a component voltage gradation of 16 dB between adjacent component voltage taps. ATT2 thus forms a voltage divider with fine gradation while ATT16 is a voltage divider with coarse gradation.

ATT2 is connected on its high-voltage side with output A of operational amplifier OA and on its low-voltage side with signal ground connection SGND. Each of the component voltage taps of ATT2 is connected via controllable electronic switch S21 to S28 with the high-voltage side of ATT16, whose low-voltage side is likewise connected with signal ground connection SGND. FIG. 5 shows only switch S21 associated with the uppermost component voltage tap of ATT2. The other seven switches S22 to S28 are not drawn but only indicated by their respective switch reference signs. All these eight switches S21 to S28 are connected on their side remote from ATT2 jointly with the high-voltage side of ATT16.

Associated in turn with the four component voltage taps of ATT16 are controllable electronic switches S31, S32, S33, S34, respectively, whereby again only uppermost switch S31 is shown and the other three switches are only indicated by their reference signs S32 to S34. The sides of switches S31 to S34 remote from ATT16 are connected jointly with feedback input − of OA.

The switching states of switches S21 to S28 are controlled by a digital switch control circuit, first decoder D1, while the switching states of switches S31 to S34 are controlled by another digital switch control circuit, second decoder D2. In the shown embodiment D1 is a 3/8 decoder which converts 3-bit control data words supplied to its input side into switch control signals which it can conduct via eight output lines to gates of electronic switches S21 to S28. In accordance with the data content of the particular 3-bit control data word, this renders a selected one of the eight switches S21 to S28 conductive while rendering the others nonconductive. In accordance with the control data value of the particular control data word, one of the component voltage taps of ATT2 is therefore connected with the high-voltage side of ATT16.

In corresponding fashion, the control through second decoder D2 formed as a 2/4 decoder renders one of the four switches S31 to S34 associated with second voltage divider ATT16 conductive while rendering the other three switches nonconductive, so that feedback input − of operational amplifier OA is connected with one of the four component voltage taps of ATT16 in accordance with the 2-bit control data word supplied to D2.

In this way the digital switch control signals supplied to decoders D1 and D2 serve to adjust a very definite feedback for operational amplifier OA, which leads to a certain gain of the audio signal supplied to input signal connection E.

The symbols used in FIG. 5 for switches S21 and S31 stand for electronic switches having a configuration shown in FIG. 2. These switches consist of a parallel connection of an NMOS transistor having an N-channel and a PMOS transistor having a P-channel. The gate electrodes of NMOS and PMOS are connected with control signal input SE, the gate electrode of NMOS directly and the gate electrode of PMOS via inverter INV. Therefore both transistors NMOS and PMOS of the electronic switch are always rendered conductive or nonconductive depending on the type of control signal supplied to control signal input SE. Control signal input SE is connected with a corresponding output signal line of first decoder D1 or second decoder D2. In FIG. 5 the eight and four output control lines of D1 and D2, respectively, are only shown in a simplified symbolical way by one dashed line in each case.

The use of electronic switches with the configuration shown in FIG. 2 is known in the art. This type of switch is used in order to obtain better linearity than can be obtained using only one switching transistor. But this switch constructed from two parallel-connected transistors also has higher nonlinearity than is desirable for high-quality audio devices.

FIG. 3 shows the characteristic of on resistance $R_{ON}$ of a switch of the type shown in FIG. 2 as a function of input voltage V across this switch. One can see that this switch also has considerable nonlinearity despite the use of the two parallel-connected transistors NMOS and PMOS. This resistance characteristic has the lowest nonlinearity in its middle area. Therefore one places the switch-on operating point of this electronic switch so that it is in the middle between the two "humps" in the resistance characteristic. One does so by setting the operating point at VS/2, whereby VS is the supply voltage of the integrated circuit. As the sinusoidal signal indicated in FIG. 3 shows, it is subject in the switch shown in FIG. 2 to a nonlinear transmission, which leads to distortion with a factor depending on the nonlinearity of the characteristic.

The invention is intended to obtain a compensation of the distortion caused by this nonlinearity.

SUMMARY OF THE INVENTION

According to the invention one compensates the distortion of the nonlinear circuit device by disposing in the feedback circuit or in the input signal circuit of the operational amplifier a compensating circuit device having a characteristic with generally the same nonlinearity as the characteristic of the nonlinear circuit device.

If the distortion-producing circuit device is located in the feedback circuit, the compensating circuit device is disposed in the input signal circuit of the operational amplifier. If the distortion-producing circuit device is located in the input signal circuit of the operational amplifier, however, the compensating circuit device is disposed in the feedback circuit of the operational amplifier.

Operational amplifiers are usually high-gain difference amplifiers which only react to potential differences between their two inputs. Potentials supplied simultaneously to both inputs have no effect on the output signal of the operational amplifier. This applies not only to direct-voltage components but also to alternating-voltage components when they are supplied simultaneously to the two inputs of the operational amplifier. And this behavior of operational amplifiers is utilized by the invention. Without the inventive distortion compensation, the distortion-producing circuit device located in the feedback circuit or in the input signal circuit of the operational amplifier would cause a harmonic component due to nonlinearity to arise only at the feedback input or only at the signal input of the operational amplifier, and this harmonic component would produce at the difference input side of the operational amplifier a difference signal which would appear, amplified by the operational amplifier, in the output signal of the operational amplifier.

Since a compensating circuit device having the same or at least generally the same nonlinearity as the circuit device whose distortion is to be compensated is disposed according to the invention in the input signal circuit or the feedback circuit depending on whether the distortion-producing circuit device is located in the feedback circuit or in the input signal circuit, a harmonic component of the signal to be processed is also supplied to the other input of the operational amplifier. If the circuit device to be compensated and the compensating circuit device have matching nonlinearities, the same harmonic pattern is supplied to both difference inputs of the operational amplifier, so that these harmonic components produce no difference voltage between the two difference inputs and therefore do not appear in the output signal.

The inventive signal processing circuit is suitable in particular for volume controls in audio signal processing circuits, but can also be used for any other signal processing applications in which undesirably occurring distortion or harmonic components are to be eliminated by compensation. Examples of such other applications are measuring signal amplifiers or the like.

The adjusting elements, for example switch-operated voltage dividers of the type shown in FIG. 5, are disposed in the feedback circuit or in the input signal circuit of the operational amplifier depending on whether the signal is to be influenced in an amplifying or attenuating way. That is, in the case of a signal-amplifying circuit layout the distortion-producing circuit device is located in the feedback branch, and in the case of a signal-attenuating circuit layout in the input signal circuit. Therefore the distortion-compensating circuit device is disposed in the former case in the input signal circuit of the operational amplifier and in the latter case in the feedback circuit.

If an inventive signal processing circuit is used as a volume control, the adjusting device used is preferably a cascade connection of two resistor strings serving as voltage dividers with digitally controlled switch devices, as explained above in connection with FIG. 5. In the case of signal-amplifying volume control this cascade connection is located in the feedback circuit of the operational amplifier, in the case of signal-attenuating volume control it is disposed in the input circuit.

In the case of an amplifying signal processing circuit with the distortion-producing circuit device located in the feedback circuit of the operational amplifier, the distortion-compensating circuit device need not necessarily be disposed in the input signal circuit of the same operational amplifier. It can also be disposed somewhere in the signal processing chain of the total circuit at a place before or after the operational amplifier in question, where signal processing is done by another operational amplifier formed as a difference amplifier OA2. If the distortion-compensating circuit device is disposed for example at a place in the signal processing chain located (in terms of signal flow) behind the operational amplifier in whose feedback circuit a distortion-producing circuit device is located, the distortion-causing harmonic component is initially contained in the output signal of this operational amplifier but is eliminated at the place where the distortion-compensating circuit device is located, with the aid of the operational amplifier located there.

The height and the degree of nonlinearity of the characteristic shown in FIG. 3 depend on the junction of the MOS transistors of the switch device shown in FIG. 2. The greater the junction of these MOS transistors is, the lower and more compressed the characteristic shown in FIG. 3 is and the lower its nonlinearity is. If one makes the MOS junctions twice as great for example, the nonlinearity characteristic is only half as high and has only half as much nonlinearity, so that the distortion factor is also reduced to one half. To obtain a distortion factor below a certain threshold value in conventional circuits, for example with the configuration shown in FIG. 5, one must provide a certain MOS junction. If one wanted to halve the distortion factor in the conventional circuit for example, one would have to double the MOS junctions. Since a considerable number of switches of the type shown in FIG. 2 are necessary, this results altogether in a considerable increase in the space required by these MOS switches on the chip of the integrated circuit. Assuming as well that a signal processing circuit of the type shown in FIG. 5 occurs several times in an audio signal processing circuit, for example not only in the volume control but also for the loudness adjustment (aurally compensated volume adjustment), the bass adjustment and the treble adjustment, one ends up with an enormous number of switch devices of the type shown in FIG. 2 on such an integrated audio signal processing circuit. If the chip area of each of the many MOS transistors required must be doubled, the space required on the chip is greatly increased to achieve such a distortion factor reduction in the conventional way.

This is all no problem using the inventive signal processing circuit, since one can afford to use MOS switch devices with a small MOS junction because the distortion produced thereby is compensated by the inventive measure. With the inventive measure one can thus not only obtain a considerable reduction of the distortion factor in a technically simple way, but also achieve a considerable saving of chip area at the same time.

DETAILED DESCRIPTION OF THE INVENTION

The invention will now be explained more closely with reference to embodiments.

Figure 1:
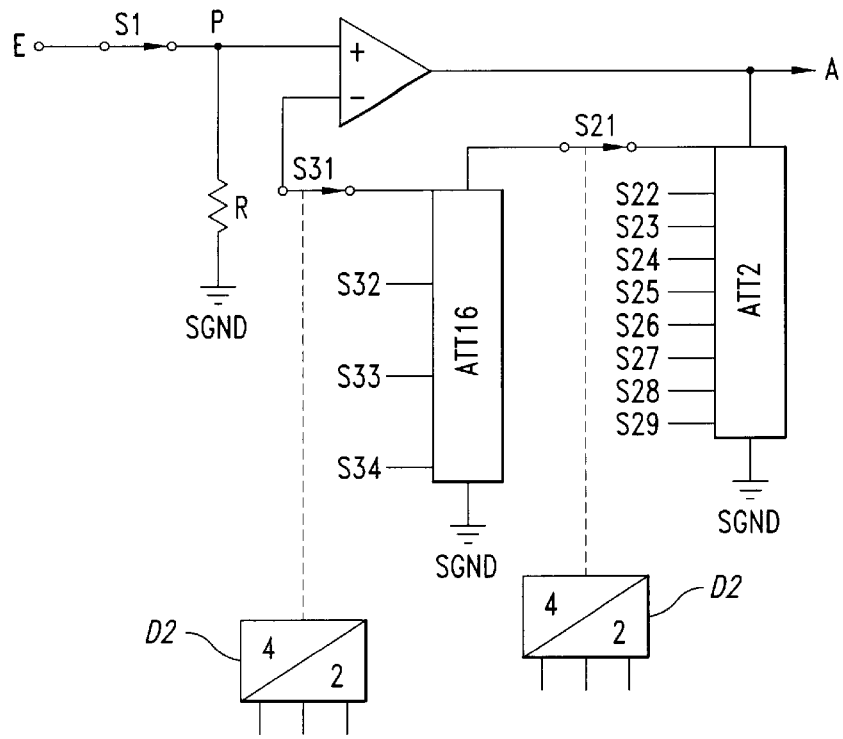
FIG. 1 shows a first embodiment of an inventive signal processing circuit in the form of an amplifying volume control.
Figure 2:
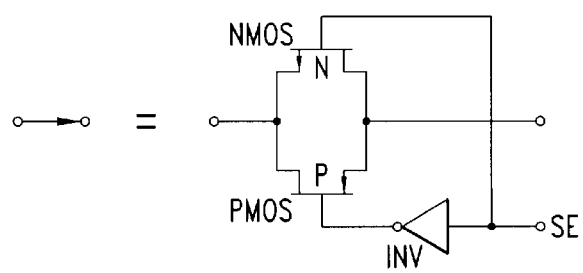
FIG. 2 shows an embodiment of the conventional switch device explained above.
Figure 5:
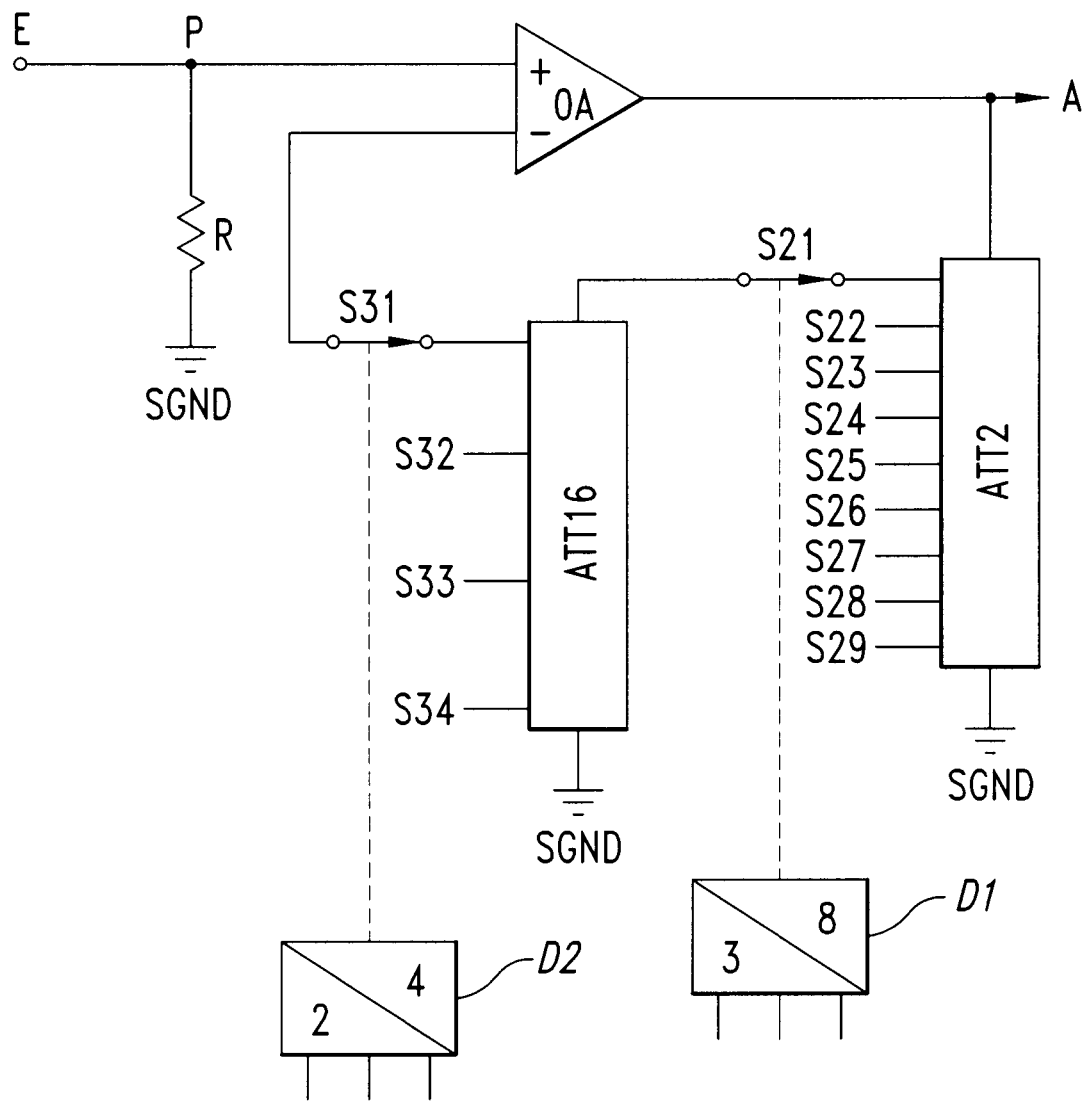
FIG. 5 shows conventional volume control considered at the outset.

FIG. 1 shows a signal-amplifying volume control with adjusting elements in the feedback circuit of an operational amplifier. Comparison of FIGS. 1 and 5 show that some portions of the amplifying volume controls generally match each other. The inventive volume control of FIG. 1 differs from the volume control shown in FIG. 5 in that disposed between input signal connection B and switching point P is distortion-compensating switch device S1. This switch S1 having exactly the same circuit configuration as the switch devices used in the feedback circuit, i.e., having the circuit configuration shown in FIG. 2 with a parallel connection of an NMOS transistor and a PMOS transistor, the two MOS transistors having the same MOS junctions as are used for the switch devices located in the feedback branch.

Since the circuits shown in FIGS. 1 and 5 otherwise match, reference is made to the circuit configuration and the functional description for FIG. 5 for the parts of the circuit shown in FIG. 1 going beyond switch device S1, thus matching reference numbers are also used.

One can also explain the distortion compensation as follows. A feedback operational amplifier works in such a way that it tries to equalize the voltages at its noninverting input and its inverting input, i.e., at its signal input and its feedback input in the case of FIGS. 1 and 5. The current flowing through S1 and through load resistor R in FIG. 1 is as great as the current flowing for example through S21 and ATT16. If one equalizes the resistance values of load resistor R and ATT16 and uses switch devices of the type shown in FIG. 2 with the same design, in particular MOS junction, for the switch devices in the feedback branch, for example S21, and distortion-compensating switch device S1, the currents flowing into the signal input and into the feedback input of operational amplifier OA are not only equal, but distortion-producing switch device S21 and distortion-compensating switch device S1 are also operated at the same operating point of the nonlinear characteristic shown in FIG. 3, so that both switch devices cause the same harmonic component and thus the same distortion. Due to the operational amplifier's attempt to equalize the voltages at its two inputs + and −, the distortion produced in the feedback circuit is therefore compensated by the distortion produced by compensating switch device S1.

Figure 4:
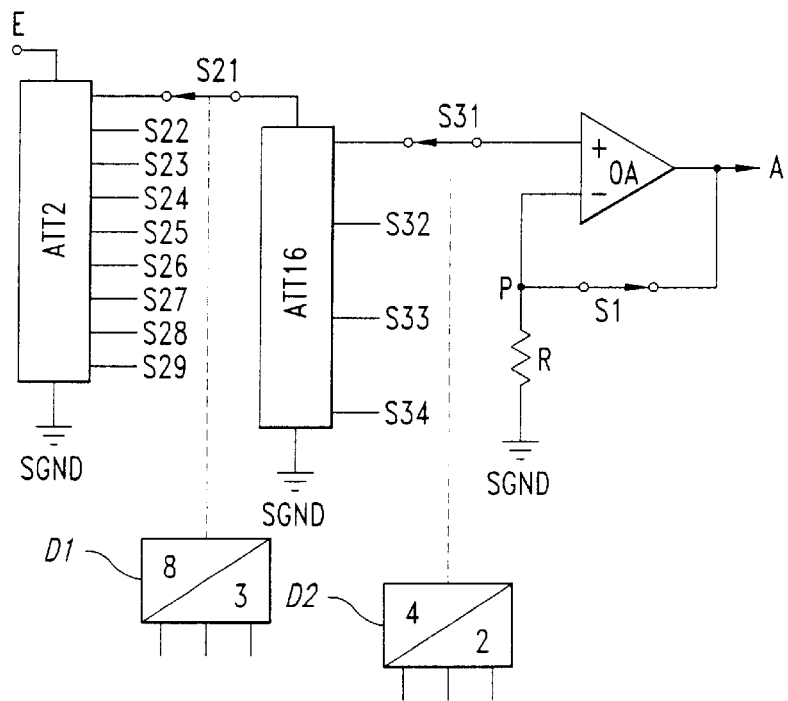
FIG. 4 shows a second embodiment of an inventive signal processing circuit in the form of an attenuating volume control.

FIG. 4 shows an embodiment of an inventive signal processing circuit in the form of an attenuating volume control. It has the cascade connection of finely graded voltage divider ATT2 and coarsely graded voltage divider ATT16 in the input circuit of operational amplifier OA, so that the distortion-producing switch device is also located in the input circuit. Since the distortion-compensating circuit device must always be disposed in the other input circuit of the operational amplifier so that distortion compensation can occur, the distortion-compensating switch device is disposed in the feedback branch of the operational amplifier in this embodiment.

Since the same circuit components are used in the embodiment shown in FIG. 4 as in the embodiment shown in FIG. 1, the same reference signs are also used. Since voltage divider cascade connection ATT2 and ATT16 has the same configuration and same mode of operation as in the volume controls shown in connection with FIGS. 1 and 5, reference is made to FIGS. 1 and 5 for the configuration and operation of the voltage divider cascade in FIG. 4.

Both for the embodiment shown in FIG. 1 and for the embodiment shown in FIG. 4, load resistor R belonging to compensating switch device S1 should have the same resistance value as the resistor string of voltage divider ATT16 for optimal distortion compensation. And this applies to the resistance value which ATT16 has between signal ground connection SGND and that component voltage tap whose switch device is rendered conductive. In the most relevant attenuation range of the voltage divider cascade, which is between 0 to 14 dB, voltage divider ATT16 is adjusted to 0 dB so that the total resistance of ATT16 is between the particular effective switch device of switch devices S21 to S28 associated with ATT2 and signal ground connection SGND. Therefore one preferably gives load resistor R the same resistance value as the total resistor string of voltage divider ATT16 in practical embodiments.

If one of the other component voltage taps of ATT16 is activated by the corresponding one of switch devices S31 to S34 being rendered conductive, no complete distortion compensation occurs but rather a partial compensation, which in any case leads to a better result than in the conventional embodiment of FIG. 5, in which there is no distortion compensation whatsoever.

Figure 3:
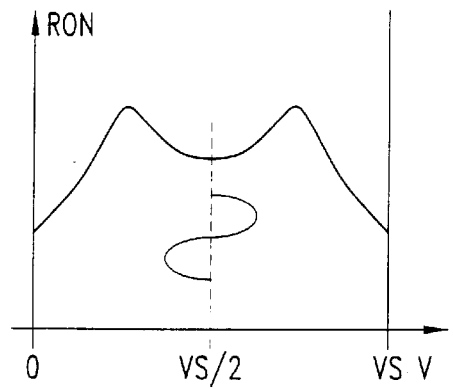
FIG. 3 shows the above-considered nonlinear characteristic of the switch device shown in FIG. 2.

Switch devices S31 to S34 belonging to voltage divider ATT16 likewise have a nonlinearity of the type shown in FIG. 3, but produce no distortion because they are connected at one end with very high-ohmic feedback input − of operational amplifier OA so that they conduct virtually no current.

Figure 6:
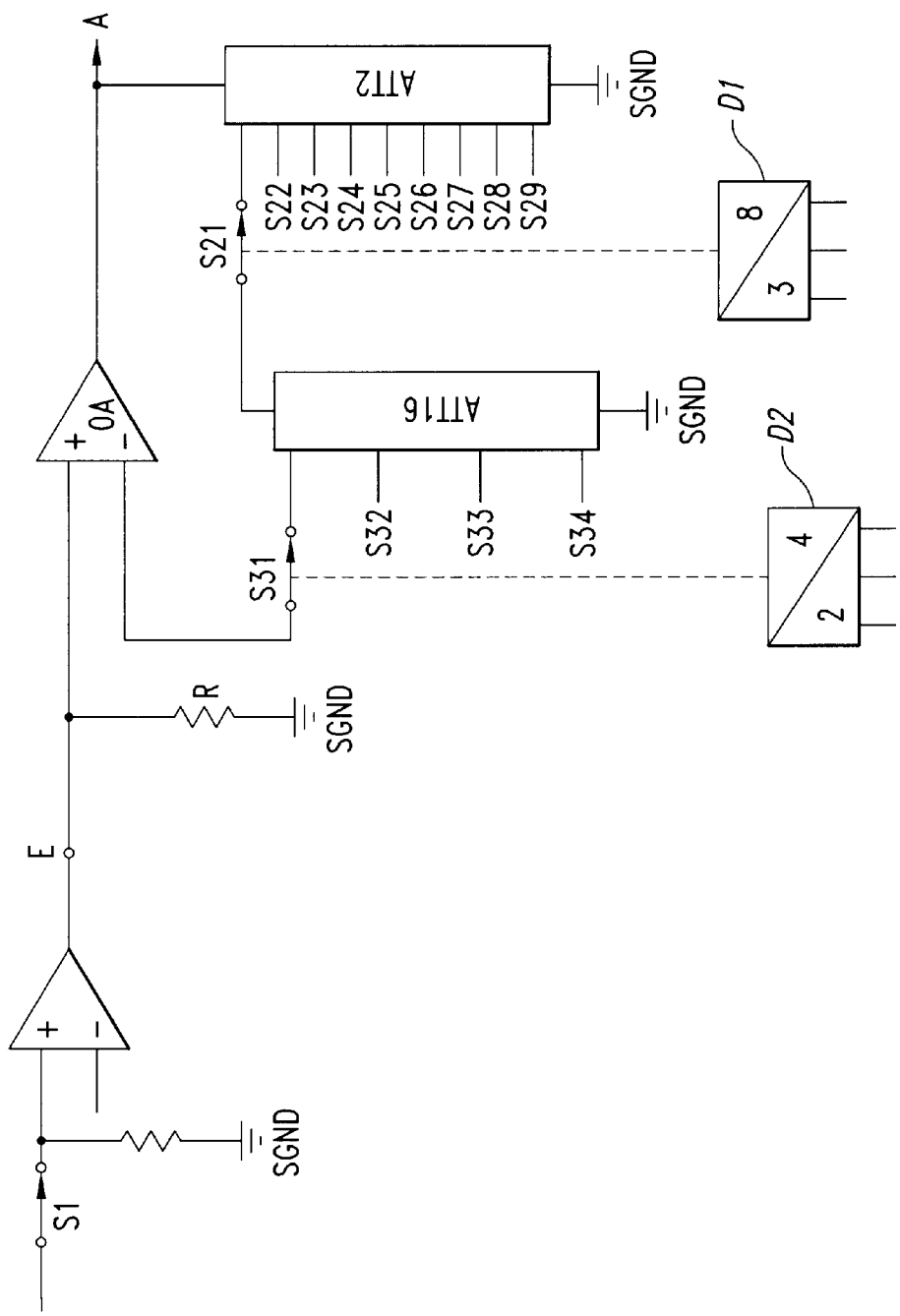
FIG. 6 shows the circuit of FIG. 1 preceding an additional opamp in a signal processing circuit.
Figure 7:
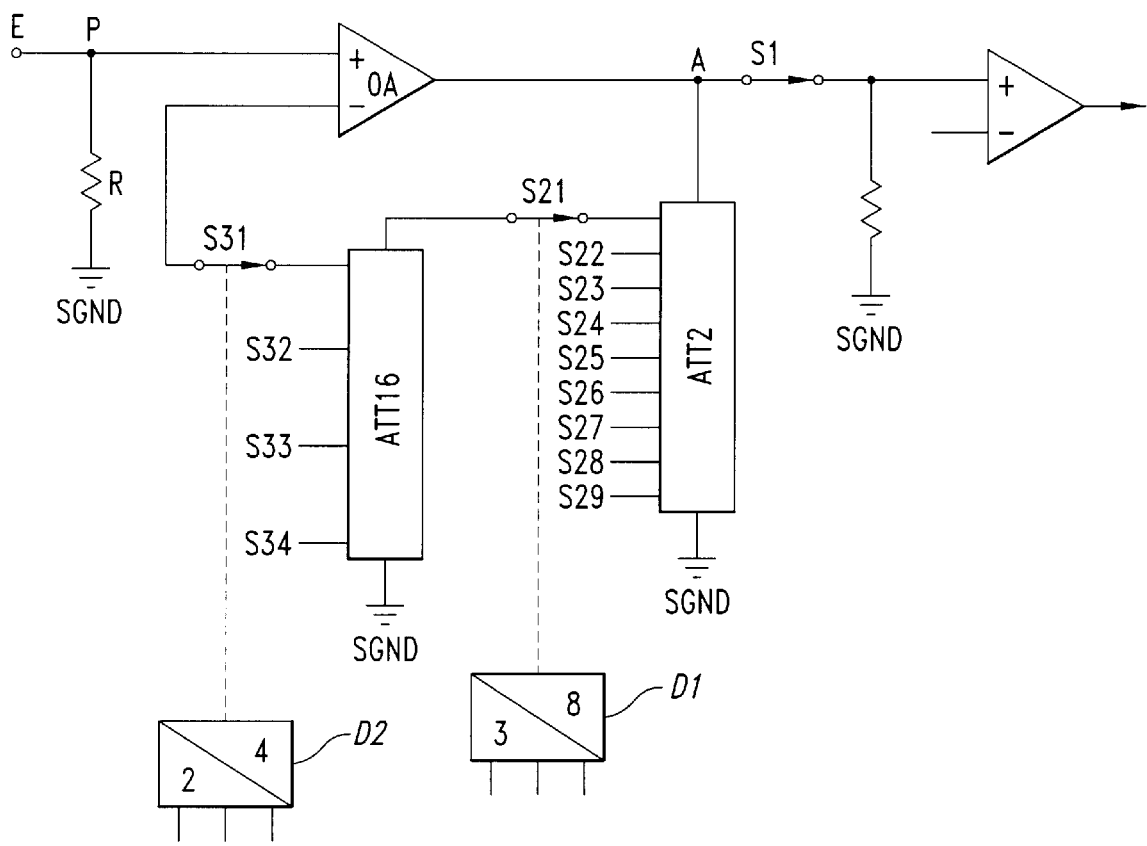
FIG. 7 shows a circuit of FIG. 4 following an additional opamp in a signal processing circuit.

In the case of an amplifying signal processing circuit with the distortion-producing circuit device located in the feedback circuit of the operational amplifier, the distortion-compensating circuit device S1 need not necessarily be disposed in the input signal circuit of the same operational amplifier. It can be disposed somewhere in the signal processing chain of the total circuit at a place before (FIG. 6) or after (FIG. 7) the operational amplifier (OA) in question, where signal processing is done by another operational amplifier (OA2) formed as a difference amplifier. If the distortion-compensating circuit device S1 is disposed for example at a place in the signal processing chain located (in terms of signal flow) behind the operational amplifier (OA) in whose feedback circuit a distortion-producing circuit device is located (FIG. 7), the distortion-causing harmonic component is initially contained in the output signal of this operational amplifier but is eliminated at the place where the distortion-compensating circuit device S1 is located, with the aid of the operational amplifier (OA2) located there. The signal processing circuit wherein the compensating circuit device is disposed, not in the input signal circuit of that operational amplifier (OA) in whose feedback circuit the distortion-producing circuit device is located, but in the input circuit of another operational amplifier (OA2) located before or after the first mentioned operational amplifier (OA), is shown in FIGS. 6 and 7.

We claim:

1. An electric signal processing circuit having an input signal receiving terminal and a signal reference potential receiving terminal, comprising:

an operational amplifier having a signal input, a feedback input, a signal output, an input circuit connected to the signal input, and a feedback circuit between the feedback input and the signal output;

a first resistor string;

a second resistor string in cascade connection with the first resistor string, each of the first and the second resistor strings being a voltage divider having a number of component voltage taps, a low voltage side and a high-voltage side, the low voltage side coupled with the signal reference potential receiving terminal and the high-voltage side of the first resistor string coupled with the input signal receiving terminal;

a first controllable electronic switch device with a distortion-producing nonlinearity characteristic selectively coupling at least one of the component voltage taps of the first resistor string with the high-voltage side of the second resistor string;

a second controllable electronic switch device selectively coupling at least one of the component voltage taps of the second resistor string with the signal input of the operational amplifier;

a compensating circuit device having a characteristic with generally the same nonlinearity as the characteristic of the first controllable electronic switch device disposed in the feedback circuit of the operational amplifier for compensating the distortion of the first controllable electronic switch device; and a load resistor connected between a circuit node located between the feedback input and the compensating circuit device, and the signal reference potential terminal.

2. The signal processing circuit of claim 1, wherein the first and the second resistor stings have different-sized component voltage gradations such that the signal processing circuit forms a signal level adjusting device.

3. The signal processing circuit of claim 1, wherein the input signal receiving terminal couples to an audio signal source to receive an audio signal, and the first and the second resistor stings have different-sized component voltage gradations such that the signal processing circuit forms a volume control in an audio signal processing device.

4. The signal processing circuit of claim 1 wherein the first controllable electronic switch device and the compensating device each have a parallel connection with a PMOS transistor having a P-channel and an NMOS transistor having an N-channel, the two transistors of each parallel connection being adapted to be rendered conductive or nonconductive simultaneously, and the two transistors of the first controllable electronic switch device both being rendered conductive or nonconductive depending on whether the first controllable switch device is to be rendered conductive or nonconductive, while the two transistors of the compensating device are rendered conductive permanently.

5. The signal processing circuit of claim 1 wherein the controllable electronic switch devices have gates which are connected with control signal outputs of a digital switch control circuit.

6. An electric signal processing circuit having an input signal receiving terminal and a signal reference potential receiving terminal, comprising:

an operational amplifier having a signal input, a feedback input, a signal output, an input circuit connected to the signal input;

a first resistor string;

a second resistor string in cascade connection with the first resistor string, each of the first and the second resistor strings being a voltage divider having a number of component voltage taps, a low voltage side and a high-voltage side, the low voltage side coupled with the signal reference potential receiving terminal and the high-voltage side of the first resistor string coupled with the signal output;

a first controllable electronic switch device with a distortion-producing nonlinear characteristic selectively coupling at least one of the component voltage taps of the first resistor string with the high-voltage side of the second resistor string;

a second controllable electronic switch device selectively coupling at least one of the component voltage taps of the second resistor string with the feedback input of the operational amplifier;

a compensating circuit device having a characteristic with generally the same nonlinearity as the characteristic of the first controllable electronic switch device coupled between the input signal receiving terminal and the signal input of the operational amplifier to compensating for the distortion of the first controllable electronic switch device; and a load resistor connected between a circuit node located between the signal input and compensating circuit device, and the signal reference potential receiving terminal.

7. The signal processing circuit of claim 6 wherein the first and the second resistor strings have different-sized component voltage gradations such that the signal processing circuit forms an adjustable signal amplifier.

8. The signal processing circuit of claim 6 wherein the input signal receiving terminal couples to an audio signal source to receive an audio signal, and the first and the second resistor strings have different-sized component voltage gradations such that the signal processing circuit forms an adjustable signal amplifier in an audio signal processing device.

9. The signal processing circuit of claim 6 wherein the first controllable electronic switch device and the compensating device each have a parallel connection with a PMOS transistor having a P-channel and an NMOS transistor having an N-channel, the two transistors of each parallel connection being adapted to be rendered conductive or nonconductive simultaneously, and the two transistors of the first controllable electronic switch device both being rendered conductive or nonconductive depending on whether the first controllable electronic switch device is to be rendered conductive or nonconductive, while the two transistors of the compensating device are rendered conductive permanently.

10. The signal processing circuit of claim 6 wherein the controllable electronic switch devices have gates which are connected with control signal outputs of a digital switch control circuit.

11. An electric signal processing circuit having an input signal receiving terminal and a signal reference potential receiving terminal, comprising:

a first operational amplifier having a signal input, a feedback input, a signal output, an input circuit connected to the signal input;

a first resistor string;

a second resistor string in cascade connection with the first resistor string, each of the first and the second resistor strings being a voltage divider having a number of component voltage taps, a low voltage side and a high-voltage side, the low voltage side coupled with the signal reference potential receiving terminal and the high-voltage side of the first resistor string coupled with the signal output;

a first controllable electronic switch device with a distortion-producing nonlinear characteristic selectively coupling at least one of the component voltage taps of the first resistor string with the high-voltage side of the second resistor string;

a second controllable electronic switch device selectively coupling at least one of the component voltage taps of the second resistor string with the feedback input of the first operational amplifier;

a compensating circuit device having a characteristic with generally the same nonlinearity as the characteristic of the first controllable electronic switch device disposed in the input circuit of a second operational amplifier located before the first operational amplifier, regarded in the direction of signal flow; and a load resistor connected between a circuit node located between the signal input and compensating circuit device, and the signal reference potential receiving terminal.

12. An electric signal processing circuit having an input signal receiving terminal and a signal reference potential receiving terminal, comprising:

a first operational amplifier having a signal input, a feedback input, a signal output, an input circuit connected to the signal input;

a first resistor string;

a second resistor string in cascade connection with the first resistor string, each of the first and the second resistor strings being a voltage divider having a number of component voltage taps, a low voltage side and a high-voltage side, the low voltage side coupled with the signal reference potential receiving terminal and the high-voltage side of the first resistor string coupled with the signal output;

a first controllable electronic switch device with a distortion-producing nonlinear characteristic selectively coupling at least one of the component voltage taps of the first resistor string with the high-voltage side of the second resistor string;

a second controllable electronic switch device selectively coupling at least one of the component voltage taps of the second resistor string with the feedback input of the first operational amplifier;

a compensating circuit device having a characteristic with generally the same nonlinearity as the characteristic of the first controllable electronic switch device disposed in the input circuit of a second operational amplifier located after the first operational amplifier, regarded in the direction of signal flow; and a load resistor connected between a circuit node located between the signal input and compensating circuit device, and the signal reference potential receiving terminal.

13. The signal processing circuit of claim 11 wherein the two resistor strings have different-sized component voltage gradations.

14. The signal processing circuit of claim 12 wherein the two resistor strings have different-sized component voltage gradations.

15. The signal processing circuit of claim 11 wherein the first controllable electronic switch device and the compensating device each have a parallel connection with a PMOS transistor having a P-channel and an NMOS transistor having an N-channel, the two transistors of each parallel connection being adapted to be rendered conductive or nonconductive simultaneously, and the two transistors of the first controllable electronic switch device both being rendered conductive or nonconductive depending on whether the first controllable electronic switch device is to be rendered conductive or nonconductive, while the two transistors of the compensating device are rendered conductive permanently.

16. The signal processing circuit of claim 12 wherein the first controllable electronic switch device and the compensating device each have a parallel connection with a PMOS transistor having a P-channel and an NMOS transistor having an N-channel, the two transistors of each parallel connection being adapted to be rendered conductive or nonconductive simultaneously, and the two transistors of the first controllable electronic switch device both being rendered conductive or nonconductive depending on whether the first controllable electronic switch device is to be rendered conductive or nonconductive, while the two transistors of the compensating device are rendered conductive permanently.

* * * * *